(12) United States Patent
Cai et al.

(10) Patent No.: US 9,679,822 B1
(45) Date of Patent: Jun. 13, 2017

(54) METHOD FOR MONITORING EPITAXIAL GROWTH GEOMETRY SHIFT

(71) Applicant: Alpha and Omega Semiconductor Incorporated, Sunnyvale, CA (US)

(72) Inventors: Boxiu Cai, Portland, OR (US); Lingbing Chen, Portland, OR (US); Yiming Gu, Hillsboro, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/050,209

(22) Filed: Feb. 22, 2016

(51) Int. Cl.
*H01L 21/336* (2006.01)
*H01L 21/66* (2006.01)
*H01L 21/027* (2006.01)
*H01L 21/02* (2006.01)

(52) U.S. Cl.
CPC .......... *H01L 22/12* (2013.01); *H01L 21/0243* (2013.01); *H01L 21/0274* (2013.01); *H01L 21/02532* (2013.01); *H01L 21/02658* (2013.01)

(58) Field of Classification Search
CPC .................................................. H01L 29/7813
See application file for complete search history.

(56) References Cited

U.S. PATENT DOCUMENTS

| 8,889,493 B2 * | 11/2014 | Yoshimochi | .......... H01L 29/866 257/E21.384 |
| 2013/0335109 A1 | 12/2013 | Chen et al. | |
| 2014/0034976 A1 * | 2/2014 | Chu | ........................ H01L 33/08 257/93 |

FOREIGN PATENT DOCUMENTS

WO   WO 02/25708 A2   3/2002

* cited by examiner

*Primary Examiner* — Zandra Smith
*Assistant Examiner* — Andre' C Stevenson
(74) *Attorney, Agent, or Firm* — Chen-Chi Lin

(57) ABSTRACT

A method of monitoring an epitaxial growth geometry shift is disclosed. First, second and third trenches are formed on a semiconductor wafer. An epitaxial layer is grown. The epitaxial layer covers the first trenches and the second trenches but not the third trenches. First and second recesses on a top surface of the epitaxial layer are formed. First and second openings aligned with the first and the second recesses and a third openings aligned with the third trenches are formed in a photoresist layer. A corresponding first offset between a top center and a bottom center of each first recess is measured. An offset value of the top center from the bottom center of said each first recess is determined. A corresponding second offset between a top center of each second recess and a center of corresponding second opening is determined. A corresponding third offset between a center of each third trench and a center of corresponding third opening is measured. A corresponding offset value of each second recess from the difference between corresponding second offset and corresponding third offset is determined.

19 Claims, 11 Drawing Sheets

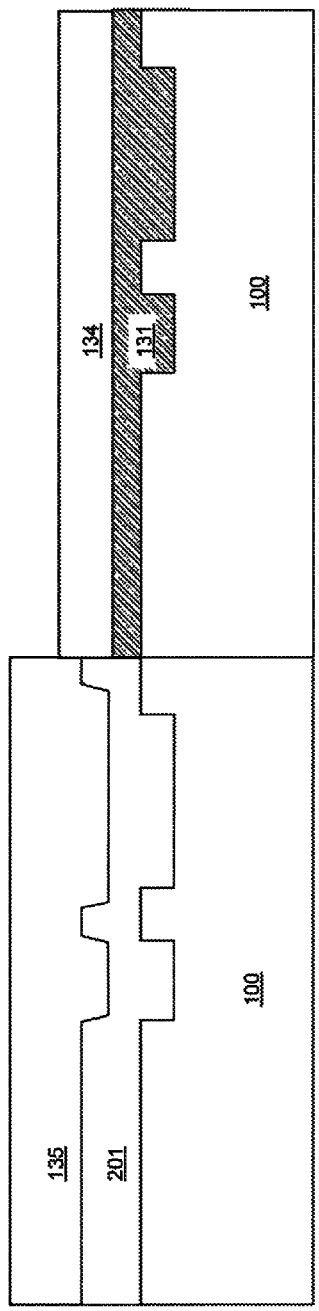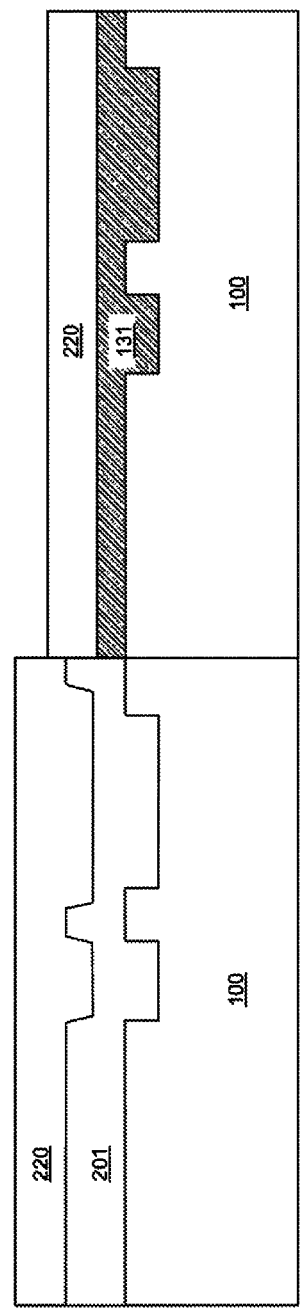

METHOD FOR MONITORING EPITAXIAL GROWTH GEOMETRY SHIFT

FIELD OF THE INVENTION

This invention relates to the epitaxial growth in manufacturing semiconductor devices. More particularly, this invention relates to a method for monitoring the geometry shift of the epitaxial growth to optimize the epitaxial growth process.

BACKGROUND OF THE INVENTION

Epitaxial growth is a very important step in a design process of a semiconductor device. For example, it is one of the key factors for a device to achieve a complex charge balance. However, during an actual manufacturing process, the epitaxial growth may distort or shift the surface geometries of various parts in the semiconductor device defined by a lithography process and an etching process. The distortion of the semiconductor device will impact the subsequent processes in terms of alignment and overlay control uncertainty. The existing technologies cannot accurately detect shape deformation factors induced by the epitaxial growth. Especially, the existing technologies cannot accurately point out impact mechanisms of the epitaxial growth environment and the corresponding process parameters associated with shape deformation factors. It leads to the failure of effectively implementing an epitaxial process optimization. Epitaxial growth induced feature magnification can be quantified by available Critical Dimension metrology, such as optical detection or SEM. The quantification may be achieved by comparing the feature sizes before the pre-epitaxial growth with the feature sizes after the post-epitaxial growth. However, there is no existing solution for monitoring the epitaxial growth geometry shift. For example, there is no known method to determine whether an original alignment mark made on a substrate's surface before the epitaxial growth and the retained alignment mark on the epitaxial layer formed after the epitaxial growth are completely overlapped, or whether there is any shift between the retained alignment mark on the epitaxial layer and the original alignment marks on the substrate.

BRIEF DESCRIPTION OF THE DRAWINGS

FIGS. 9A-9G are cross-sectional schematic diagrams illustrating an alternative method for obtaining the first, second and third geometry shifts in the first, second and third trenches.

DETAILED DESCRIPTION OF THE INVENTION

Figure 1A:
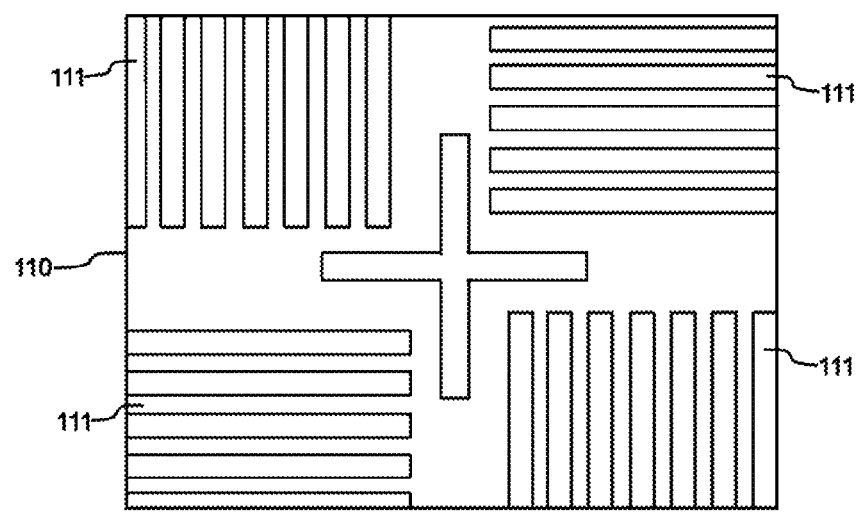
FIGS. 1A-1C are schematic diagrams illustrating the shift of an alignment mark.
Figure 1B:
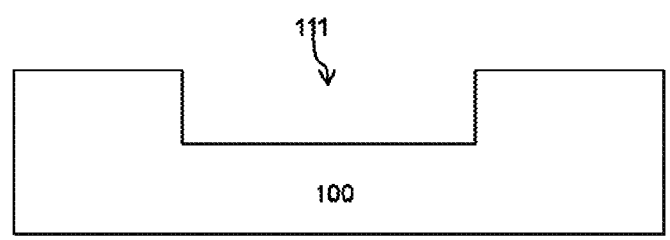
Figure 1C:
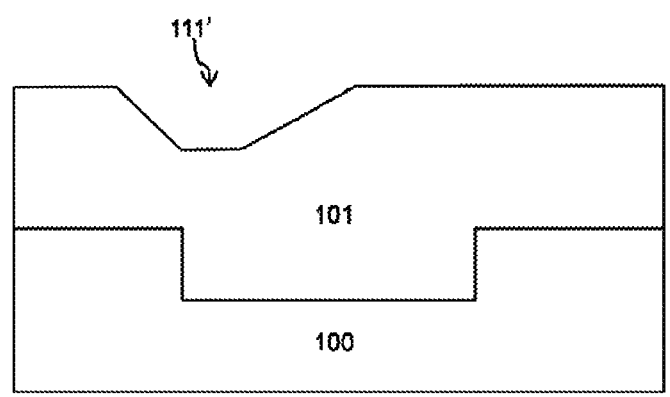

In FIGS. 1A-1B, an alignment mark 110 is formed on a top surface of a substrate 100 of a semiconductor wafer as a reference target for alignment. Precise dimensions of devices of the semiconductor wafer are maintained after performing alignment processes. The alignment mark 110 includes a plurality of horizontal and vertical trenches 111 formed on the top surface of the substrate 100. In FIGS. 1B-1C, an epitaxial layer 101 is formed on the top surface of the substrate 100 through an epitaxial growth process. The epitaxial layer 101 covers the top surface of the substrate 100 and filling the trenches 111. Therefore, the trenches 111 are invisible and cannot be used as alignment marks. Trenches 111 formed on the top surface of the substrate 100 result in the top surface of the epitaxial layer 101 being non-planar. Therefore, recesses 111' are formed on a top surface of the epitaxial layer 101 at regions above the trenches 111.

In FIG. 1C, the epitaxial layer 101 is approximately uniformly grown on the top surface of the substrate 100 at regions with or without trenches 111. Therefore, recesses 111' are formed at the top surface of the epitaxial layer 101 in the regions above the trenches 111. Portions of the top surface of the epitaxial layer 101 without trenches 111 formed underneath are higher than other portions with trenches 111 formed underneath. Recesses 111' is formed at the top surface of the epitaxial layer 101 at the regions with trenches 111 formed below. In an ideal state, if epitaxial layer 101 has no geometry shift, each recess 111' is completely superimposed on a corresponding trench 111. However, an actual epitaxial growth process will lead to the geometry shift between an actual position and an expected position of the epitaxial layer 101 of the ideal state. After the epitaxial growth process, each recess 111' and the corresponding trench 111 are not completely superimposed to each other. The alignment in subsequent process will fail because of the geometry shift of the growth epitaxial layer. Each recess 111' is then used as a regenerated alignment mark instead of using the corresponding trench 111 as the original alignment mark.

Figure 2:
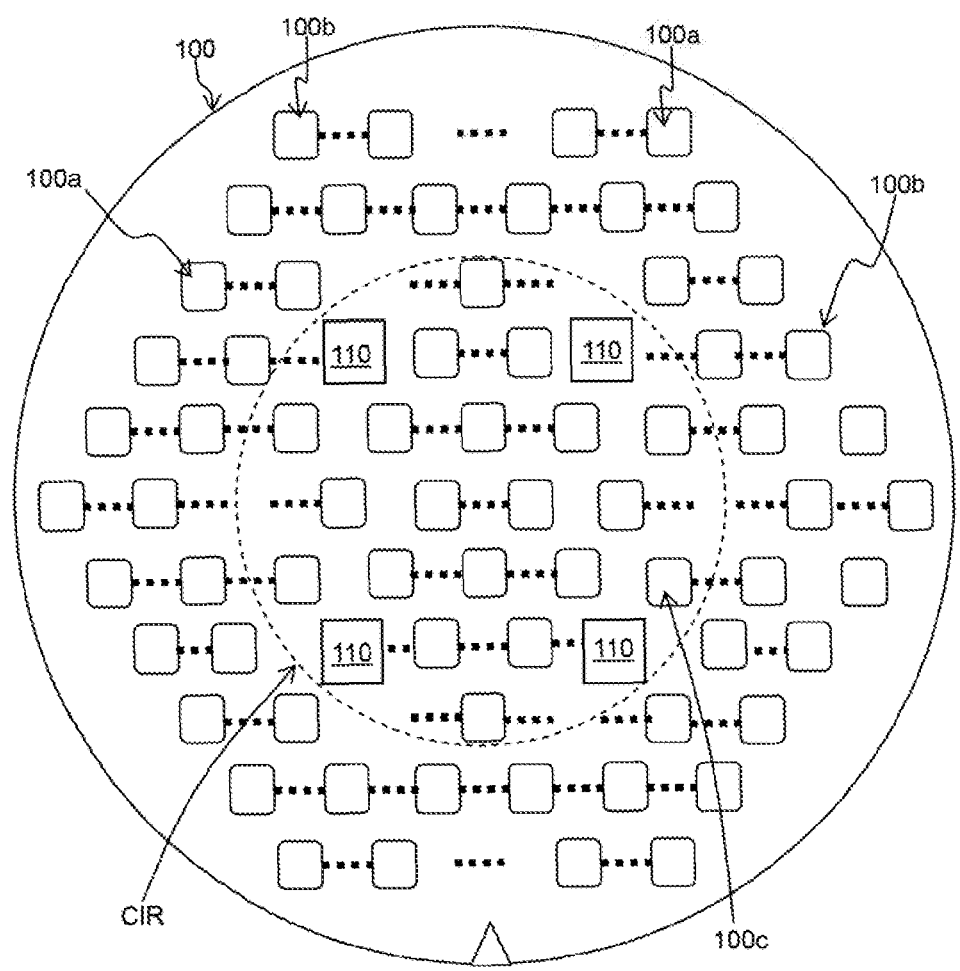
FIG. 2 is a top view schematic diagram illustrating the distribution of the first, second and third trenches on a wafer.

In FIG. 2, multiple trenches including first trenches 100a, second trenches 100b and third trenches 100c are formed on a top surface of a semiconductor substrate 100 of a wafer. In examples of the present disclosure, the wafer is a dummy wafer. The third trenches 100c and the alignment marks 110 are located near the center of the wafer. The first trenches 100a and the second trenches 100b are located near the periphery of the wafer. The sizes of the first trenches 100a, the second trenches 100b and the third trenches 100c can be different. After the trenches are formed on substrate 100, the area enclosed by dotted line CIR is blocked from the epitaxial growth by having a shield plate. An epitaxial layer 101 is grown on the top surface of the substrate 100. The epitaxial layer 101 is not formed on the area enclosed by the dotted line CIR.

Figure 3A:
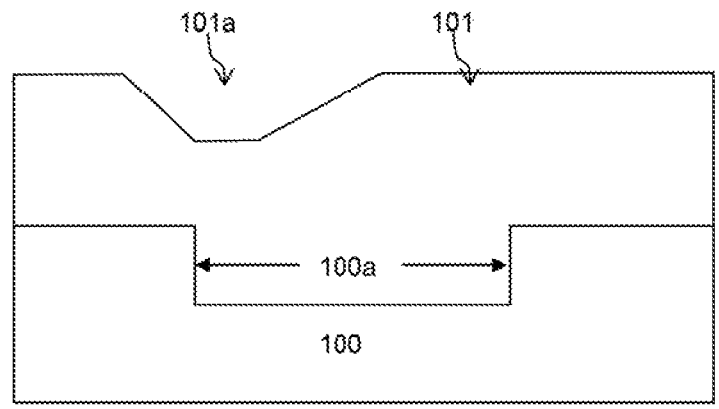
FIGS. 3A-3C are cross-sectional schematic diagrams illustrating the step of growing an epitaxial layer in the first and second trenches but not in the third trenches.
Figure 3B:
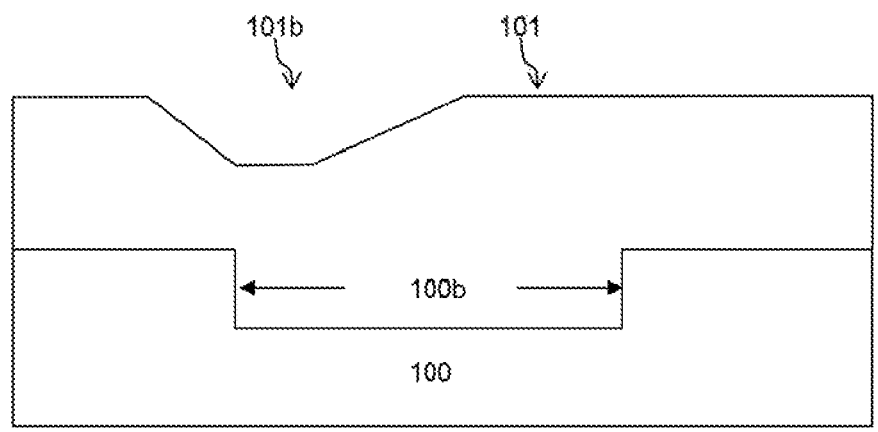
Figure 3C:
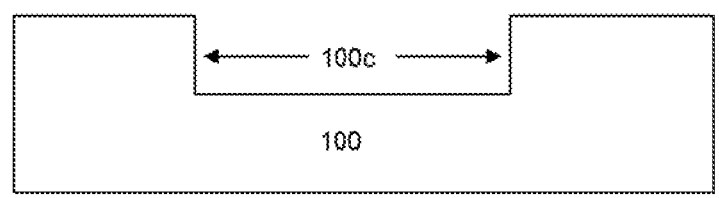

In FIGS. 3A-3C, a selected first trench 100a in FIG. 3A and a selected second trench 100b in FIG. 3B are located outside the dotted CIR area. For demonstration purpose, only one trench is shown in FIGS. 3A-3C respectively. A selected third trench 100c in FIG. 3C is in the dotted CIR area. The epitaxial layer 101 is grown in the selected first trench 100a and the selected second trench 100b, but not in the selected third trench 100c. As a result, a first recess 101a is formed on the top surface of the epitaxial layer 101 corresponding to the selected first trench 100a. A second recess 101b is formed on the top surface of the epitaxial layer 101 corresponding to the selected second trench 100b. The first recess 101a and the selected first trench 100a are not completely superimposed to each other. The second recess 101b and the selected second trench 100b are not completely superimposed, but with a slight geometry shift.

Figure 4A:
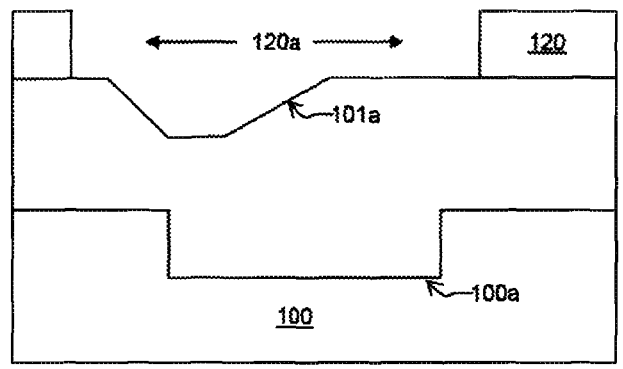
FIGS. 4A-4C are cross-sectional schematic diagrams illustrating the step of depositing a photoresist atop the epitaxial layer on the first and second trenches and atop the third trenches following by forming an opening in the photoresist atop each trench.
Figure 4B:
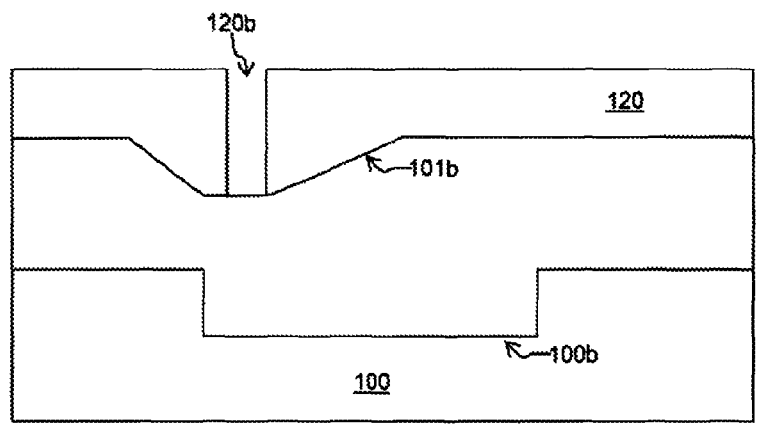
Figure 4C:
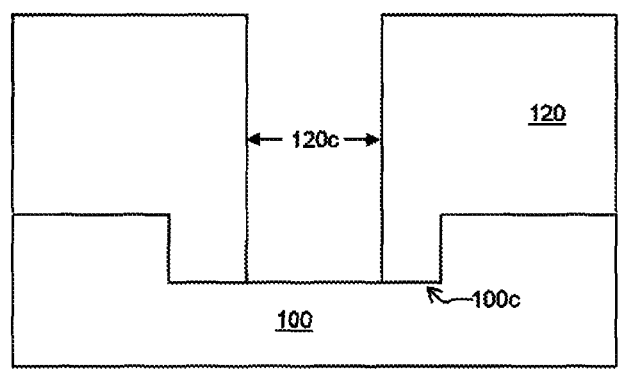

In FIGS. 4A-4C, a photoresist layer 120 is coated atop the wafer of FIGS. 3A-3C covering all the areas of selected trenches 100a, 100b and 100c. In examples of the present disclosure, the photoresist layer 120 covers the epitaxial layer 101 and the exposed area of the selected third trench 100c of the substrate 100. A lithography process (for example, exposing and developing the photoresist layer 120) is then performed so as to form the first opening 120a in FIG. 4A, the second opening 120b in FIG. 4B, and the third opening 120c in FIG. 4C. The first opening 120a is aligned with the first recess 101a, the second opening 120b is aligned with the second recess 101b, and the third opening 120c is aligned with the selected third trench 100c. In examples of the present disclosure, the size of the first opening 120a is larger than that of the first recess 101a, so that the first recess 101a is completely exposed from the first opening 120a. The size of the second opening 120b is smaller than that of the second recess 101b, so that a portion of a floor of the second recess 101b is exposed from the second opening 120b. The size of the third opening 120c is smaller than that of the selected third trench 100c, so that a portion of a floor of the selected third trench 100c is exposed from the third opening 120c.

Figure 5A:
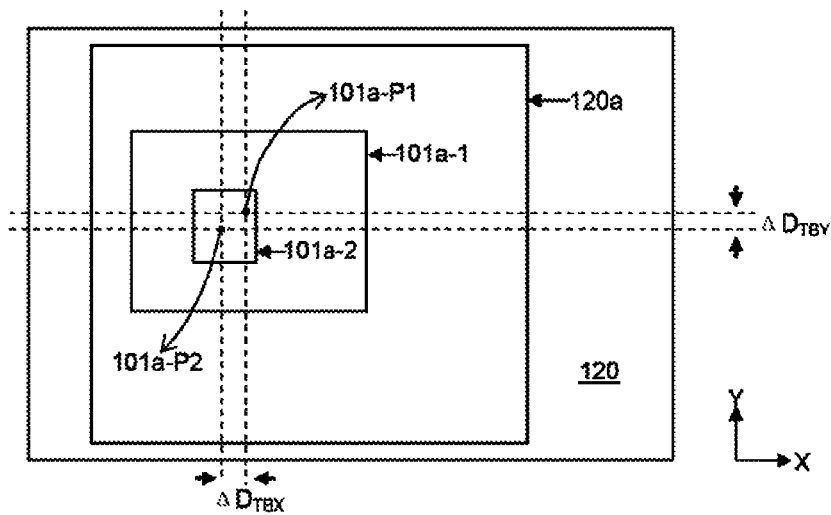
FIGS. 5A-5C are top view schematic diagrams corresponding to cross-sectional schematic diagrams in FIGS. 4A-4C.
Figure 5B:
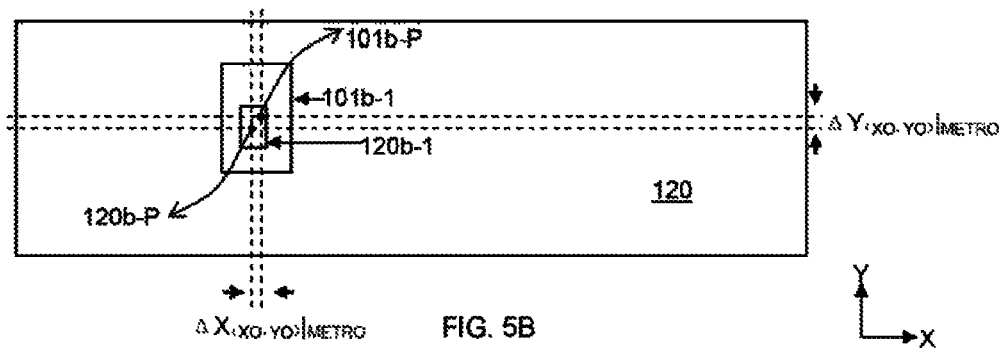
Figure 5C:
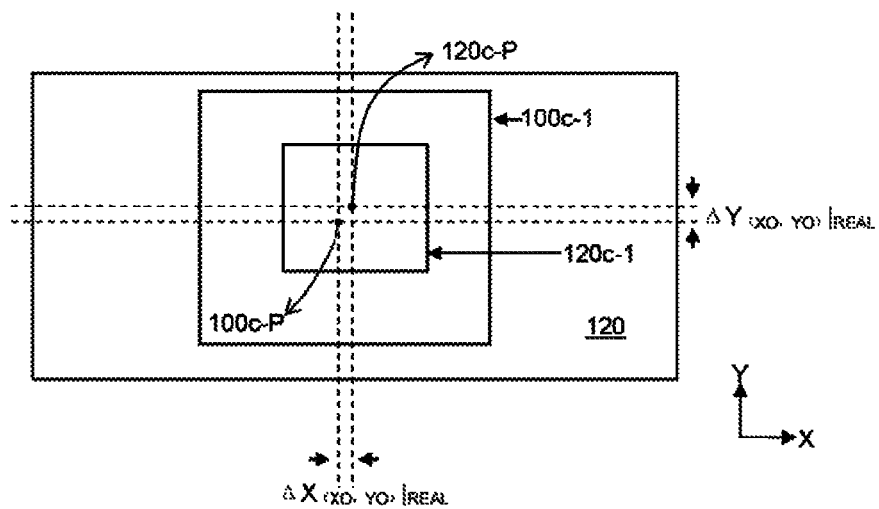
Figure 6A:
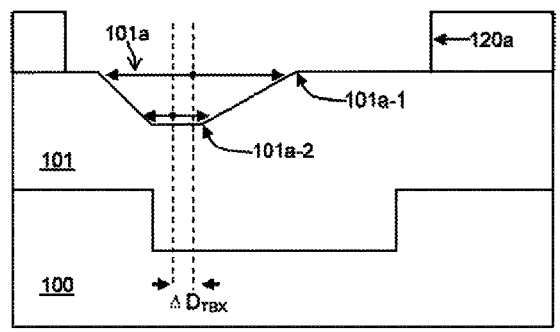
FIGS. 6A-6C are cross-sectional schematic diagrams illustrating the methods of measuring the geometry shift of the epitaxial layer.
Figure 7A:
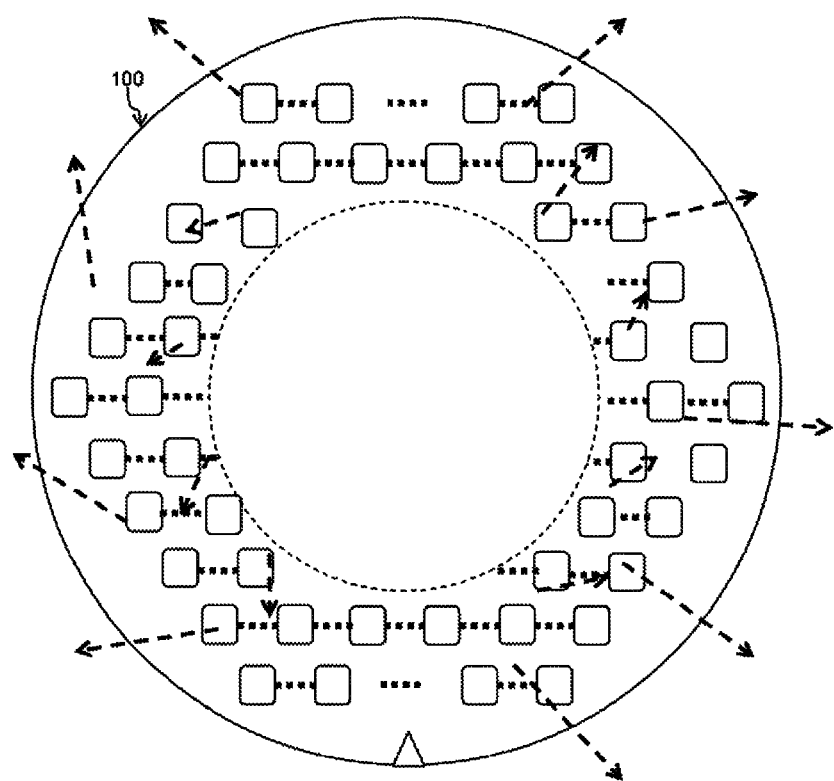
FIGS. 7A-7B are top view and cross-sectional schematic diagrams illustrating the first pattern shift measured between top centers and bottom centers of first openings in the first trenches.
Figure 7B:
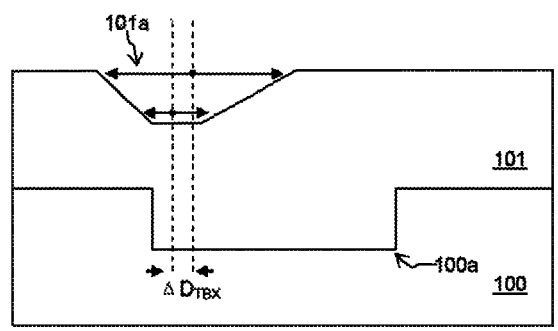

FIGS. 5A-5C are top views of FIGS. 4A-4C respectively. In FIG. 5A, the selected first recess 101a is completely exposed from the first opening 120a. In examples of the present disclosure, the first opening 120a and the first recess 101a are of square shapes. In FIG. 6A, the first recess 101a include a bottom edge 101a-2 and a top edge 101a-1. Because of the geometric shift caused by the epitaxial growth process, as shown in FIG. 5A, a bottom center 101a-P2 of the first recess 101a (or the center of the rectangle formed by the bottom edges 101a-2) and top center 101a-P1 of the selected first recess 101a (or the center of the rectangle formed by the top edges 101a-1) are not superimposed by having a first offset between them. The first offset includes a component $\Delta D_{TBX}$ along X axis of the Cartesian coordinates. $\Delta D_{TBX}$ is the distance between the top center 101a-P1 and the bottom center 101a-P2 along X axis. The first offset further includes a component $\Delta D_{TBY}$ along Y axis of the Cartesian coordinates. $\Delta D_{TBY}$ is the distance between the top center 101a-P1 and the bottom center 101a-P2 along Y axis. After taking measurements of a number of samples of the first trenches 100a and the corresponding first recesses 101a, a corresponding deviation of the first offset of each first recess 101a is determined. FIG. 7A is a top view of the wafer with a vector diagram shown the results of the above mentioned samples. It can be used as a reference for adjusting the parameters to optimize the epitaxial growth process by tuning the first offset as small as possible (FIG. 7B).

Figure 6B:
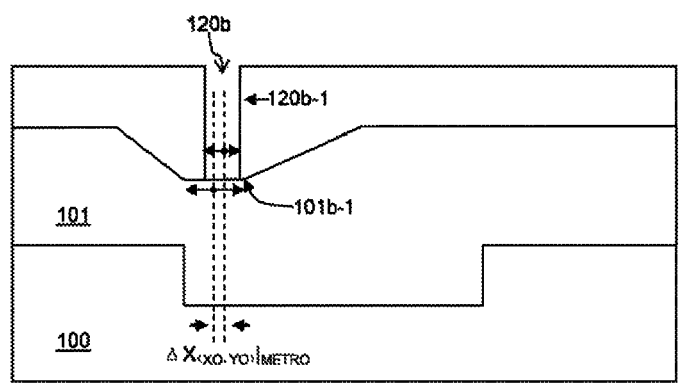

Referring now to FIG. 5B and FIG. 6B, only a portion of the floor of the second recess 101b are exposed from the second opening 120b. In examples of the present disclosure, the second opening 120b and the second recess 101b are of square shapes. The second recess 101b includes a bottom edge 101b-1 and a top exposed edge. The second offset between a bottom (or top) center 101b-P of the second recess 101b (i.e. the center of rectangle formed by the bottom edges 101b-1) and a center 120b-P of the second opening 120b (i.e. the center of rectangle formed by the edges 120b-1 of the second opening 120b) can be determined using the bottom center 101b-P of the second recess 101b and center 120b-P of the second opening 120b. The second offset includes a component $\Delta X_{(XO, YO)}|_{METRO}$ along X axis of the Cartesian coordinates. $\Delta X_{(XO, YO)}|_{METRO}$ is the distance between the bottom center 101a-P of the second recess 101b (or its top center) and center 120b-P of the second opening 120b along X axis. The second offset further includes a component $\Delta Y_{(XO, YO)}|_{METRO}$ along Y axis of the Cartesian coordinates. $\Delta Y_{(XO, YO)}|_{METRO}$ is the distance between bottom center 101b-P of the second recess 101b (or its top center) and center 120b-P of the second opening 120b along Y axis.

Figure 6C:
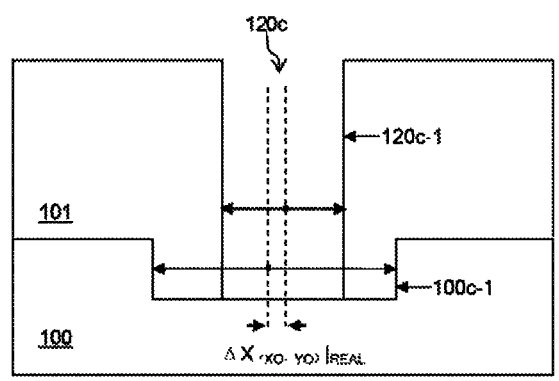

In FIG. 5C and FIG. 6C, only a portion of the floor of the selected third trench 100c is exposed from the third opening 120c. In examples of the present disclosure, the third opening 120c and the selected third trench 100c are of square shapes. The selected third trench 100c includes a bottom (or top) edge 100c-1. The third opening 120c includes a bottom (or top) edge 120c-1. A third offset is between a center 100c-P of the selected third trench 100c (i.e., the center of the rectangle formed by the edges 100c-1) and a center 120c-P of the third opening 120c (i.e., the center of the rectangle formed by the edges 120c-1 of the third opening 120c). The third offset includes a component $\Delta X_{(XO, YO)}|_{REAL}$ along X axis of the Cartesian coordinates. $\Delta X_{(XO, YO)}|_{REAL}$ is a distance between bottom (or top) center 100c-P of the selected third trench 100c and center 120c-P of the third opening 120c along X axis. The third offset further includes a component $\Delta Y_{(XO, YO)}|_{REAL}$ along Y axis of the Cartesian coordinates. $\Delta Y_{(XO, YO)}|_{REAL}$ is a distance between bottom (or top) center 100c-P of the selected third trench 100c and center 120c-P of the third opening 120c along Y axis.

In a coordinate system, a point is marked with a preset coordinates $(X_O, Y_O)$ that can be the origin or any random point. Upon establishing the stable pattern shift vector map as described above, a compensation mode as shown below can be fitted to represent the unique signature of the specific epitaxial growth process condition:

$$X - X_O = f(X_O, Y_O);$$

$$Y - Y_O = g(X_O, Y_O);$$

where (X, Y) is a coordinate of a randomly selected point. The above mode can be applied as a feed forward filter onto optically acquired overlay metrology data to get real displacement data as follows:

$$\Delta X_{(XO,YO)}|_{REAL} = \Delta X_{(XO,YO)}|_{METRO} - f(X_O, Y_O);$$

$$\Delta Y_{(XO,YO)}|_{REAL} = \Delta Y_{(XO,YO)}|_{METRO} - g(X_O, Y_O).$$

As a result, the coordinate of the point (X, Y) on epitaxial layer 101 of a wafer is related to the functional relationship from the preset coordinates $(X_O, Y_O)$ as follows:

$$X - X_O = \Delta X_{(XO,YO)}|_{METRO} - \Delta X_{(XO,YO)}|_{REAL};$$

$$Y - Y_O = \Delta Y_{(XO,YO)}|_{METRO} - \Delta Y_{(XO,YO)}|_{REAL}.$$

Figure 8A:
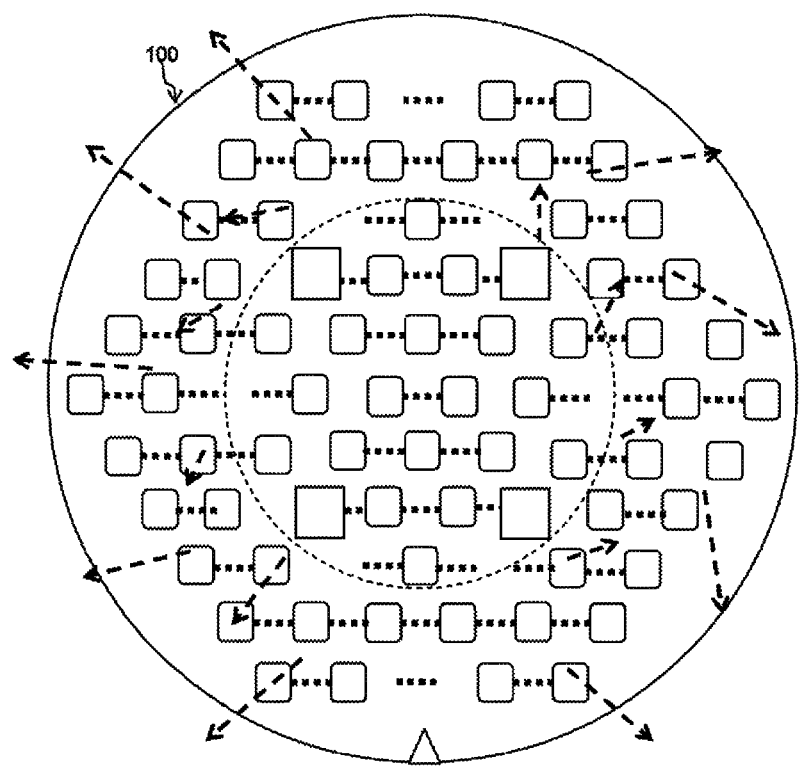
FIGS. 8A-8B are top view and cross-sectional schematic diagrams illustrating second pattern shifts of second openings in the second trenches obtained from the differences between the second and third geometry shifts in the second and third trenches.
Figure 8B:
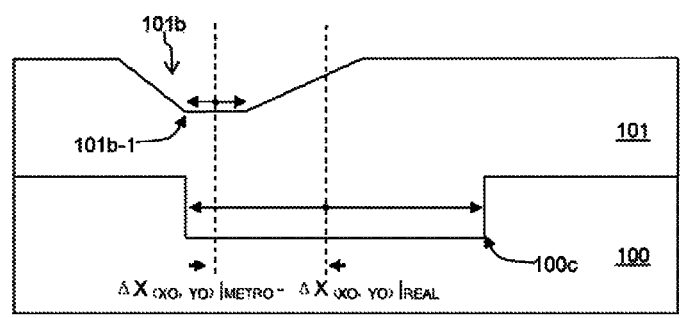

The coordinate of the point (X,Y) can be used to define the position of each recess formed on epitaxial layer 101 resulted from filling a corresponding trench formed on the top surface of the substrate 100. Therefore, the coordinate vector diagram of all the recesses on the surface of epitaxial layer 101 can be obtained (as shown in FIGS. 8A-8B). Vector diagram can be used as a process adjustment basis to adjust the epitaxial growth process to improve the alignment of the recesses and the corresponding trenches. Therefore, the epitaxial growth process is optimized when the epitaxial growth geometry shift is minimal.

Figure 9A:
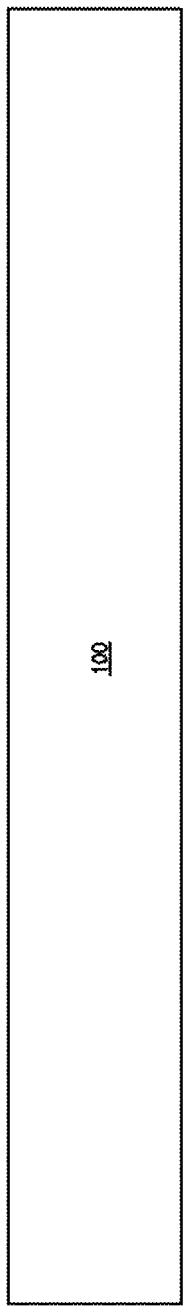
Figure 9B:
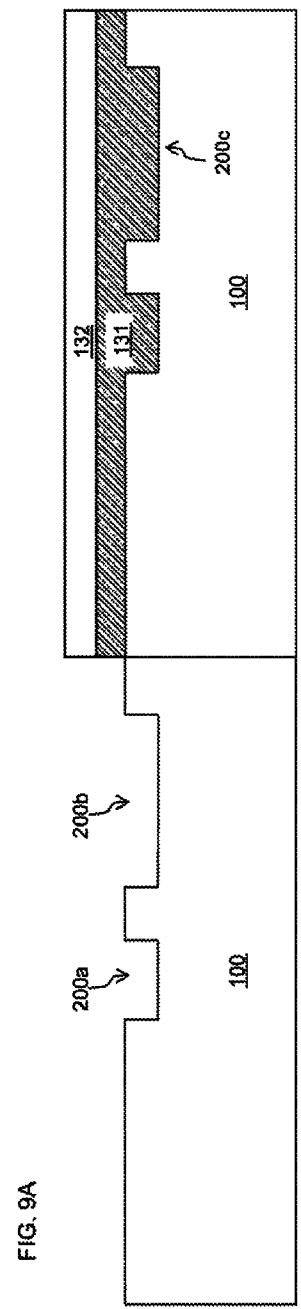

In another example, FIGS. 9A-9G shows an example of the implementation of the above compensation mode without using a shield plate to block an area from the epitaxial growth process on the wafer. In FIGS. 9A-9B, a selected first trench 200a, a selected second trench 200b and a selected third trench 200c are formed on the top surface of a semiconductor substrate 100 by etching or other methods. In examples of the present disclosure, the semiconductor substrate 100 may include a plurality of first, a plurality of second, and a plurality of third trenches. The selected first trench 200a and the selected second trench 200b are formed on a first area of substrate 100. The selected third trench 200c is formed on a second area. In one example, the first area is the center area of the wafer, and the second area is the edge area of the wafer. In another example, the first area is the edge area of the wafer, and the second area is the center area of the wafer. A passivation layer, for example, an oxide layer 131, is deposited or grown on the top surface of substrate 100. The oxide layer 131 covers the surface of the substrate 100 and fills the trenches. A photoresist layer 132 is coated on the oxide layer 131 and is subjected to the photolithography exposure development. Then, the oxide layer 131 in the first area is exposed. The photoresist layer 132 is used as an etching mask for etching away the oxide layer 131 in the first area. At this stage, the selected third trench 200c in the second area is still filled with the oxide layer 131. The selected first trench 200a and the selected second trench 200b are exposed in the first area.

Figure 9C:
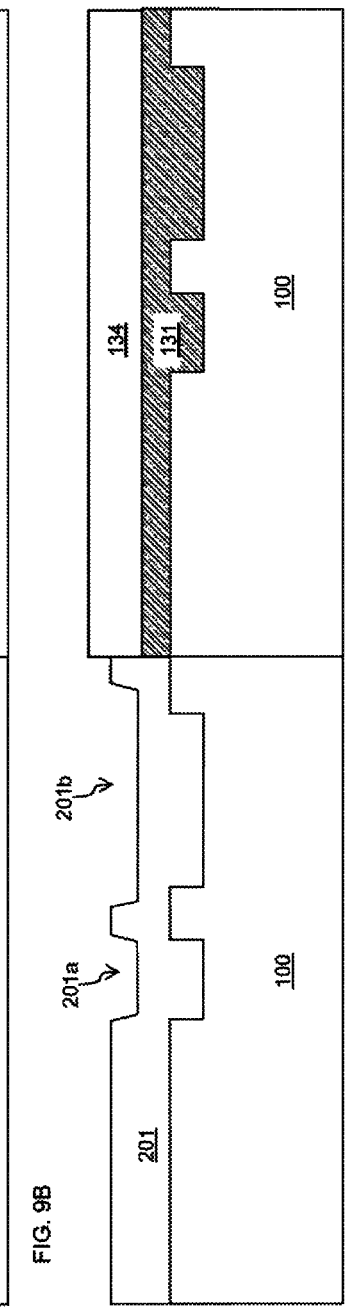

In FIG. 9C, the photoresist layer 132 in the second area is removed, for example, by etching. An epitaxial growth process is carried out on the wafer. An epitaxial layer 201 is formed on the exposed silicon material of the substrate 100 in the first area of the wafer. A polysilicon layer 134 is formed on the oxide layer 131 in the second area. The epitaxial layer 201 also covers the selected first trench 200a and the selected second trench 200b in the first area. A first recess 201a is formed on the top surface of the epitaxial layer 201 above the selected first trench 200a. A second recess 201b is formed on the top surface of the epitaxial layer 201 above the selected second trench 200b. The portion of the top surface of the epitaxial layer 201 above the trenches 200a and 200b is lower than other portions of the top surface. It forms a stepped structure in the first area of the top surface of the epitaxial layer 201.

In FIG. 9D, a photoresist layer 135 is formed. The photoresist layer 135 covers the epitaxial layer 201 in the first area and the polysilicon layer 134 in the second area of the substrate 100. The photoresist layer 135 is subjected to a photolithography exposure development to completely expose the polysilicon layer 134 in the second area. The photoresist layer 135 is then used as an etching mask for etching away the polysilicon layer 134. The photoresist layer 135 is then removed, for example, by etching.

Figure 9F:
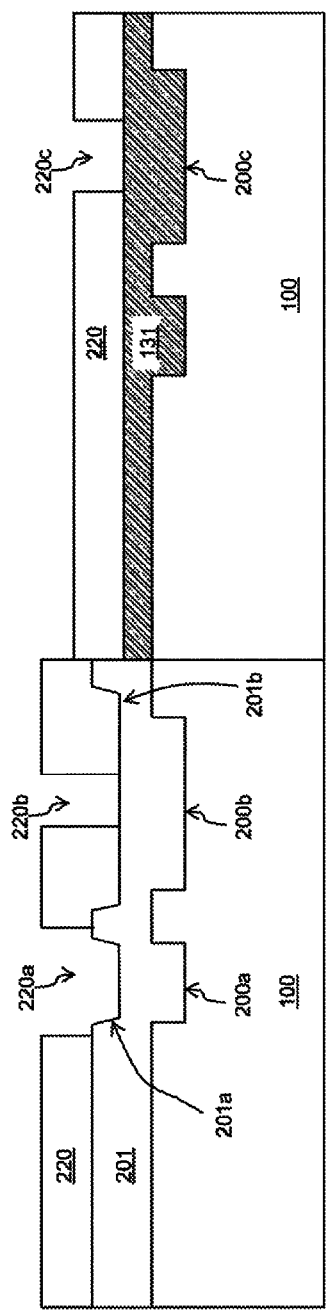

In FIG. 9E, a photoresist layer 220 is formed on top of the substrate 100. The photoresist layer 220 covers the epitaxial layer 201 in the first area and the oxide layer 131 in the second area. In FIG. 9F, a photolithography exposure development of photoresist layer 220 is carried out so as to form a first opening 220a aligned with the first recess 201a, a second opening 220b aligned with the second recess 201b and a third opening 220c aligned with the selected third trench 200c. In FIG. 9F, the oxide layer 131 filled in the selected third trench 200c is exposed from the third opening 220c. In examples of the present disclosure, the size of the first opening 220a is larger than the size of the first recess 201a so that the first recess 201a is completely exposed from the first opening 220a. The size of the second opening 220b is smaller than the size of the second recess 201b so that only a portion of the floor of the second recess 201b is exposed from the second opening 220b. The size of the third opening 220c is smaller than the size of the selected third trench 200c.

Figure 9G:
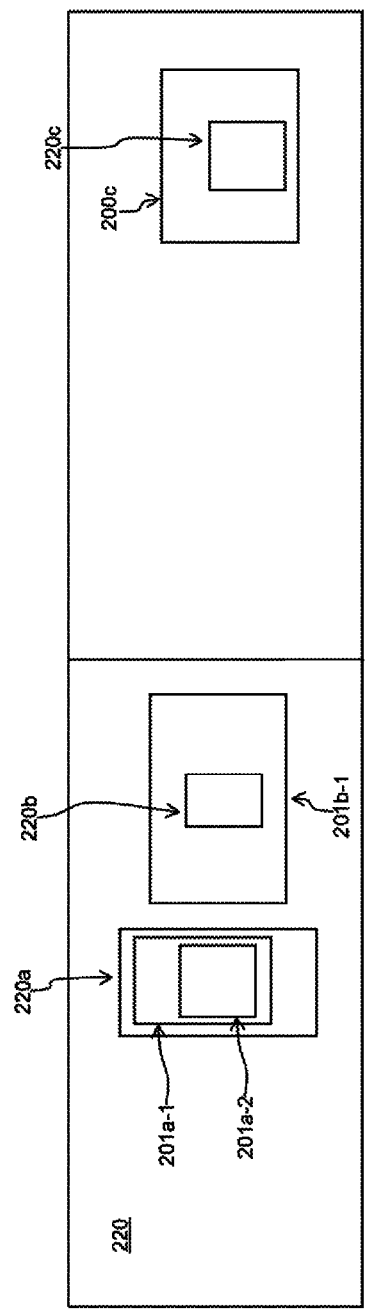

In FIG. 9G, in examples of the present disclosure, the selected first trench 200a is of a square shape. Top edges 201a-1 or bottom edges 201a-2 of the first recess 201a are also of square shapes. In examples of the present disclosure, the selected second trench 200b is of a square shape. The bottom edge 201b-1 of the second recess 201b is also a square shape. In examples of the present disclosure, the selected third trench 200c is also of a square shape.

In examples of the present examples, by comparing FIGS. 9F-9G with FIGS. 3A-3C and 4A-4C, the selected first trench 200a, the selected second trench 200b and the selected third trench 200c are equivalent to the selected first trench 100a, the selected second trench 100b and the selected third trench 100c respectively. The first recess 201a, the second recess 2010b are equivalent to the first recess 101a and the second recess 101b respectively. The first opening 220a, the second opening 220b and the third opening 220c are equivalent to the first opening 120a, the second opening 120b and the third opening 120c respectively.

Using the method as described above, the first offset between top center and bottom center of the first recess 201a can be measured. The offset value of the top of the first opening 220a from the bottom is determined. The second offset between top center and bottom center of the second recess 201b can be measured. The third offset between top center (or bottom center) of the selected third trench 200c and top center (or bottom) center of the third opening 220c can be measured. The offset value of the second recess from the difference between the second offset and the third offset can be determined.

Those of ordinary skill in the art may recognize that modifications of the embodiments disclosed herein are possible. For example, the shapes of the recesses may vary. Other modifications may occur to those of ordinary kill in this art, and all such modifications are deemed to fall within the purview of the present invention, as defined by the claims.

The invention claimed is:

1. A method for monitoring a geometry shift of an epitaxial growth, the method comprising the steps of:
   forming a plurality of first trenches, a plurality of second trenches and a plurality of third trenches on a top surface of a substrate of a semiconductor wafer;
   growing an epitaxial layer on the substrate; the epitaxial layer covering the plurality of first trenches and the plurality of second trenches; the epitaxial layer not covering the plurality of third trenches; a plurality of first recesses and a plurality of second recesses being formed on a top surface of the epitaxial layer; each first recess being above a respective first trench; and each second recess being above a respective second trench;
   depositing a photoresist layer covering the epitaxial layer, the plurality of first recesses, the plurality of second recesses and the plurality of third trenches;

performing a lithography process on the photoresist layer so as to form a plurality of first openings, a plurality of second openings, and a plurality of third openings; a respective first opening being aligned with said each first recess; a respective second opening being aligned with said each second recess; and a respective third opening being aligned with each third trench;

measuring a respective first offset between a top center and a bottom center of said each first recess; and determining a respective offset value of the top center from the bottom center of said each first recess; and measuring a respective second offset between a top center or a bottom center of said each second recess and a center of the respective second opening; measuring a respective third offset between a center of said each third trench and a center of the respective third opening; and measuring a respective offset value of said each second recess from a difference between the respective second offset and the respective third offset.

2. The method of claim 1, wherein the plurality of first trenches, the plurality of second trenches and the plurality of third trenches are of square shapes.

3. The method of claim 1, wherein the plurality of second trenches are larger than the plurality of first trenches.

4. The method of claim 1, the plurality of first openings are larger than the plurality of first recesses so as to completely expose the plurality of first recesses.

5. The method of claim 1, wherein the plurality of second openings are smaller than the plurality of second recesses so as to expose only portions of floors of the plurality of second recesses.

6. The method of claim 1, wherein the plurality of third openings are smaller than the plurality of third trenches so as to expose only portions of floors of the plurality of third trenches.

7. The method of claim 1, wherein the plurality of third trenches are covered by a plurality of shields during the step of growing the epitaxial layer.

8. The method of claim 1, wherein the respective first offset comprises a component $\Delta D_{TBX}$ along a first direction and a component $\Delta D_{TBY}$ along a second direction perpendicular to the first direction;

wherein the respective second offset comprises a component $\Delta X_{(XO, YO)}|_{METRO}$ along the first direction and a component $\Delta Y_{(XO, YO)}|_{METRO}$ along the second direction; and wherein the respective third offset comprises a component $\Delta X_{(XO, YO)}|_{REAL}$ along the first direction and a component $\Delta X_{(XO, YO)}|_{REAL}$ along the second direction.

9. The method of claim 8, wherein a preset location having a coordinate $(X_O, Y_O)$ on the epitaxial layer is determined; a selected location having a coordinate $(X, Y)$ on the epitaxial layer is determined; $X_O$ and $X$ are along the first direction; $Y_O$ and $Y$ are along the second direction;

$$X - X_O = \Delta X_{(XO,YO)}|_{METRO} - \Delta X_{(XO,YO)}|_{REAL}; \text{ and}$$

$$Y - Y_O = \Delta Y_{(XO,YO)}|_{METRO} - \Delta Y_{(XO,YO)}|_{REAL}.$$

10. A method for monitoring a geometry shift of an epitaxial layer, the method comprising the steps of:

forming a plurality of first trenches and a plurality of second trenches in a first area of a top surface of a substrate of a semiconductor wafer; and forming a plurality of third trenches in a second area of the top surface of the substrate of the semiconductor wafer;

forming an oxide layer above the second area; the oxide layer covering the plurality of third trenches;

growing an epitaxial layer on the substrate; the epitaxial layer covering the plurality of first trenches and the plurality of second trenches; forming a polysilicon layer on the oxide layer; wherein a plurality of first recesses and a plurality of second recesses are formed at a top surface of the epitaxial layer above the plurality of first trenches and the plurality of second trenches;

etching the polysilicon layer above the second area;

forming a photoresist layer covering the epitaxial layer above the first area and the oxide layer above the second area;

patterning the photoresist layer by a lithography process so as to form a plurality of first openings, a plurality of second openings, and a plurality of third openings; a respective first opening being aligned with each first recess; a respective second opening being aligned with each second recess; and a respective third opening being aligned with each third trench;

measuring a respective first offset between a top center and a bottom center of said each first recess;

measuring a respective second offset between a top or bottom center of said each second recess and a center of the respective second opening;

measuring a respective third offset between a center of said each third trench and a center of the respective third opening; and calculating a respective offset value of said each second recess from a difference between the respective second offset and the respective third offset.

11. The method of claim 10, wherein the step of forming the oxide layer above the second area comprises the sub-steps of:

forming an other oxide layer on the first and second areas;

coating a first photoresist layer on the other oxide layer;

patterning the first photoresist layer by a lithography process so as to expose the other oxide layer above the first area;

using the patterned first photoresist layer as an etching mask to remove the other oxide layer above the first area; and removing the patterned first photoresist layer.

12. The method of claim 11, wherein the step of etching the polysilicon layer above the second area comprises the sub-steps of:

coating a second photoresist layer to cover the epitaxial layer and the polysilicon layer;

patterning the second photoresist layer by a lithography process so as to expose the polysilicon layer;

using the patterned second photoresist layer as an other etching mask to remove the polysilicon layer; and removing the patterned second photoresist layer.

13. The method of claim 10, wherein the plurality of first trenches, the plurality of second trenches and the plurality of third trenches are of square shapes.

14. The method of claim 10, wherein the plurality of second trenches are larger than the plurality of first trenches.

15. The method of claim 10, wherein the plurality of first openings are larger than the plurality of first recesses so as to completely expose the plurality of first recesses.

16. The method of claim 10, wherein the plurality of second openings are smaller than the plurality of second recesses so as to expose only portions of floors of the plurality of second recesses.

17. The method of claim 10, wherein the plurality of third openings are smaller than the plurality of third trenches so as to expose only portions of floors of the plurality of third trenches.

18. The method of claim 10, wherein the respective first offset comprises a component $\Delta D_{TBX}$ along a first direction and a component $\Delta D_{TBY}$ along a second direction perpendicular to the first direction;

wherein the respective second offset comprises a component $\Delta X_{(XO, YO)}|_{METRO}$ along the first direction and a component $\Delta Y_{(XO, YO)}|_{METRO}$ along the second direction; and wherein the respective third offset comprises a component $\Delta X_{(XO, YO)}|_{REAL}$ along the first direction and a component $\Delta X_{(XO, YO)}|_{REAL}$ along the second direction.

19. The method of claim 18, wherein a preset location having a coordinate $(X_O, Y_O)$ on the epitaxial layer is determined; a selected location having a coordinate $(X, Y)$ on the epitaxial layer is determined; $X_O$ and X are along the first direction; $Y_O$ and Y are along the second direction;

$$X - X_O = \Delta X_{(XO,YO)}|_{METRO} - \Delta X_{(XO,YO)}|_{REAL}; \text{ and}$$

$$Y - Y_O = \Delta Y_{(XO,YO)}|_{METRO} - \Delta Y_{(XO,YO)}|_{REAL}.$$

\* \* \* \* \*